United States Patent [19]

Adams

[11] Patent Number: 4,962,502
[45] Date of Patent: Oct. 9, 1990

[54] OPTICAL SIGNAL PROCESSING DEVICE

[75] Inventor: Michael J. Adams, Ipswich, England

[73] Assignee: British Telecommunications public limited company, Great Britain

[21] Appl. No.: 230,835

[22] PCT Filed: Dec. 14, 1987

[86] PCT No.: PCT/GB87/00904
§ 371 Date: Aug. 11, 1988
§ 102(e) Date: Aug. 11, 1988

[87] PCT Pub. No.: WO88/04790
PCT Pub. Date: Jun. 30, 1988

[30] Foreign Application Priority Data

Dec. 15, 1986 [GB] United Kingdom ............... 8629873

[51] Int. Cl.$^5$ .............................................. H01S 3/30
[52] U.S. Cl. .......................................... 372/8; 372/38; 372/31; 372/96
[58] Field of Search .................... 372/102, 96, 38, 31, 372/8; 330/4, 5

[56] References Cited

U.S. PATENT DOCUMENTS 4,215,323  7/1980  McCall, Jr. ...................... 330/4.5
4,873,690 10/1985  Adams ................................. 372/8

FOREIGN PATENT DOCUMENTS 0169567 1/1986 European Pat. Off. .
0193819 9/1986 European Pat. Off. .

OTHER PUBLICATIONS

Bogatov et al; "Nonlinear Refraction in Semiconductor Lasers", Sov. Soc. Quant. Elect. 15(3), Mar. 1985.
Adams, M. J., Westlake, H. J., O'Mahony, M. J., Henning, I. D., IEEE J. Q. E. QE21, p. 1498—(1985).
Westlake, H. J., Adams, M. J., O'Mahony, M. J.; Electronics Letters, vol. 21, p. 992—(1985).
Adams, M. J.; IEEE J. Proc. J. Optoelectron, V132, p. 343 (1985).
Westlake, M. J., Adams, M. J., O'Mahony, M. J.; Electronics Letters, vol. 22, p. 541, (1986).
Wherrett, B. S.; IEEE, J QE, QE-20, p. 646, (1984).
IEEE Journal of Quantum Electronics, vol. qe-19, No. 11, Nov. 1983, (New York, U.S.), W. T. Tsany et al.: "Optoelectronic Logic Operations by Cleaved-Coupled-Cavity Semiconductor Lasers", pp. 1621–1625.
Applied Physics Letters, vol. 48, No. 5, Feb. 3, 1986, (Woodbury, N.Y., U.S.) W. F. Sharfin et al.: "Femtojoule Optical Switching in Nonlinear Semiconductor Laser Amplifiers", pp. 321–322.

Primary Examiner—Léon Scott, Jr.
Attorney, Agent, or Firm—Nixon & Vanderhye

[57] ABSTRACT

By using a DFB semiconductor laser amplifier (1) in reflection, it is possible to obtain a device with an optical limiting characteristic. The output signal intensity of such an amplifier (1) is substantially independent of the input signal intensity where the input signal is detuned from an output peak on the short wavelength side of a stop band of the amplifier (1), and has an intensity above a threshold value. The amplifier (1) finds particular application for instance as an optical limiter or noise filter, in optical logic and communications systems.

11 Claims, 3 Drawing Sheets

OPTICAL SIGNAL PROCESSING DEVICE

The present invention relates to an optical signal processing device. It finds particular application in optical logic and communications systems, for instance as an optical signal limiter, or as a noise filter.

It is sometimes useful in optical logic or communications systems that the intensity of an optical signal is limited to a maximum value which is at least substantially constant. Such a limited signal could for instance be used as a bias signal to ensure reproducable peak laser power in pulsed laser systems, to control pulse shapes, as a digital input signal which avoids saturating a photodetector, or to equalise signal amplitudes in a multiplex system. Further, a device which limits optical signal intensities can operate as a noise filter since modulation superimposed on an optical signal can be cut out.

It is known to use semiconductor optical devices in optical logic and signal processing. They are advantageous in that they can be designed to operate at the order of low power levels, for instance at about 10 mW which might be available in optical logic and signal processing. They physically take up little space, operate at wavelengths compatible with those common in optical logic and communications, and potentially can be monolithically integrated with other optical components.

A factor in the choice of materials for optical devices is the fact that silica optical fibers, which are the basis of present optical communications systems, have loss minima at 0.9 μm, 1.3 μm and 1.55 μm approximately. Accordingly there is an especial need for devices which show favourable characteristics when operated using optical radiation in the wavelength range from 0.8 to 1.65 μm, and especially in the ranges from 0.8 to 1.0 μm and from 1.3 μm to 1.65 μm. (These wavelengths, like all the wavelengths herein except where the context indicates otherwise, are in vacuo wavelengths). Materials which have been found suitable for the manufacture of devices which show such favourable characteristics comprise the III-V semiconductor materials, including gallium arsenide, indium gallium arsenide, gallium aluminium arsenide. indium phosphide and the quaternary materials, indium gallium arsenide phosphides ($In_x Ga_{1-x} As_y P_{1-y}$). With regard to the quaternary materials, by suitable choices of x and y it is possible to lattice-match regions of different ones of these materials to neighbouring III-V materials in a device while being able to select the associated band gap equivalent wavelength.

A known device for use in conjunction with a laser to shape pulses is a non-linear Fabry-Perot (FP) etalon. A FP etalon is a simple optical cavity which can be fabricated from semiconductor materials, having planar reflecting endfaces of about 30Å reflectivity, and (optionally) waveguiding properties. Limiting action is achieved by tuning the peak output of the etalon at low signal input to the source laser frequency as the input intensity rises, the etalon detunes, keeping the transmitted power approximately constant.

Alternatively, passing a signal through a non-linear medium can be used to limit the signal. It is known to use a device wherein the far field of the output signal spreads at increasing input powers. By using an aperture stop, the increasing input powers can be at least approximately balanced out.

Another device suggested but not demonstrated for use as an optical signal limiter is a multiple quantum well guided wave structure, also fabricated from semiconductor materials. Such a device is discussed in "Nonlinear Guided Wave Applications", Optical Engineering 24 (4) 1985, by C. T. Seaton, Xu Mai, G. I. Stegeman and H. G. Winful. Optical limiting action is obtained because either one or both of the bounding media are characterized by a self-defocusing nonlinearity.

However, known devices tend to suffer from one or more disadvantages. For instance, they might only operate at an input signal intensity higher than those suitable for optical logic or communications systems. Another disadvantage, for instance of etalons, can be that the output signal is multistable and tends to show oscillation as a consequence. In the case of a multiple quantum well device, it is likely that even if demonstrated, the devices would be difficult to manufacture, having for instance low layer thickness tolerances.

A semiconductor laser is known for use as a source of optical radiation, or as an amplifier. A laser is commonly based on a wafer grown from the III-V semiconductor materials mentioned above. The layers of the wafer are selectively doped to provide a p-n junction, in the vicinity of which lies an active region. Photons Can be generated in the active region by radiative recombination of electron-hole carrier) pairs under a driving current applied across the junction. The distribution of refractive index in the laser is such as to provide a waveguiding region along which the photons generated are guided. Feedback is provided to the waveguiding region, for instance by reflective end facets of the laser (a Fabry-Perot laser). In alternative versions, feedback may be provided in a "distributed" fashion (a DFB laser). for instance by means of corrugations in an interface which lies near the active region, or by a grating external to the laser active/waveguiding regions.

If optical radiation is input to the active region of a laser and a driving current applied, amplification of the radiation occurs even when the driving current is below the threshold current necessary for lasing action to occur. The relationship between input and output radiation intensity is non-linear and can show bistability, the output intensity switching rapidly to a new value as the input intensity reaches a relevant switching level.

A feature of a DFB laser is that the input signal will be reflected to an extent dependent on its wavelength. Any passive corrugated waveguide will act as a band reflection filter, for optical radiation of wavelength λ in free space, whose period Ω is close to the back scattering Bragg condition $$\Omega = \frac{p\lambda}{2\eta}$$

where p is an integer and $\eta$ is the effective refractive index of the material of the waveguide. This feature creates a series of stop bands within which optical radiation is substantially reflected rather than transmitted. In a DFB active device, the reflected spectral response is more complicated, showing a strong peak to either side of each stop band, caused by the device gain. (In the present specification, references to a stop band will be to the stop band relevant at very low input signal intensities.

The optical radiation can be input to a first end of the active region of a laser amplifier and the output taken from a second end of the active region i.e. the laser amplifier can be operated in transmission. Alternatively, the output can be taken from the first end also, i.e. the operated in reflection.

The relationship between input and output radiation intensity is complicated. For instance, the input radiation undergoing amplification reduces the free carrier concentration and hence the gain of the laser. The refractive index varies with gain, and the degree of amplification of the input radiation is dependent on the relationship between the input wavelength and the refractive index. Additionally, temperature will affect the refractive index and both the laser drive conditions and the input radiation affect the temperature. Hence, overall, the interaction of gain, refractive index. driving current and input radiation is difficult to specify for a particular laser.

It has now been found that a DFB laser used as an amplifier can show an optical limiting characteristic.

It is an object of the present invention to provide an optical signal processing device suitable for use as an optical limiter in optical logic or communications systems.

According to the present invention there is provided an optical signal processing device comprising a semiconductor DFB laser amplifier operated in reflection, means for coupling an optical input signal to the amplifier, the signal being detuned from an output signal peak to the short wavelength side of the wavelength range relevant to an amplifier stop band, and means for applying a driving current to the amplifier, the input signal reaching at least part of the time an intensity greater than a threshold value above which the output signal intensity of the amplifier is substantially independent of the input signal intensity.

Preferably where the input signal is a binary digital signal, its intensity for a "1" value is always greater than that threshold value.

Optical devices according to embodiments of the invention have the advantage that the relationship between input and output signal intensities can show an extensive region within which the output signal intensity is substantially independent of input signal intensity.

Further, because the amplifier is operated in reflection, the devices can offer the ability to use samples of higher linear absorption.

Because the devices are active rather than passive, there is also considerable control available over the operating parameters used.

The input-output signal intensity relationship of an amplifier according to an embodiment of the present invention can be used to limit noise in an optical signal since intensity variations of the input signal will not be reproduced. Where the signal is a binary digital signal, noise can be limited not only on "1" values of the signal, where the signal intensity lies above the threshold value, but also on "0" values. This is because if the Gaussian spread of the signal intensity., associated with noise at the "1" value, is reduced, then the decision level selected to differentiate between a "1" and a "0" value can be raised, so reducing the effect of noise on a "0" value at the decision level concerned.

An optical limiter according to an embodiment of the present invention will now be described, by way of example only, with reference to the accompanying figures in which.

Figure 1:
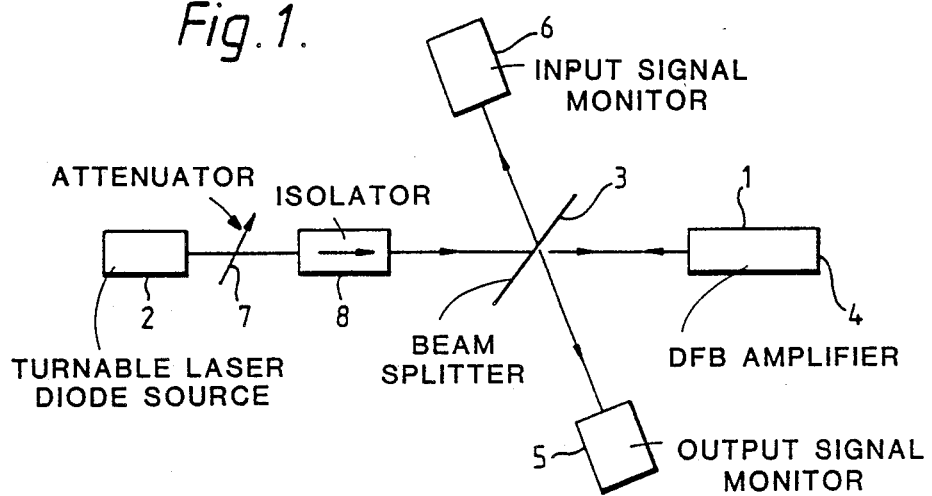
FIG. 1 shows a schematic representation of the limiter in use.

Referring to FIG. 1 the limiter comprises a DFB amplifier 1 used in reflection. An optical input signal is provided by a tunable laser diode source 2, in combination with an attenuator 7.

A beam splitter 3 mounted between the source 2 and the amplifier 1 deflects a portion of the optical output of the source 2 to an input signal monitor 6, and a portion of the output of the amplifier 1 to an output signal monitor 5. Interaction between the source 2 and the amplifier 1 is prevented by an isolator 8, between the beam splitter 3 and the source 2, and the attenuator 7 is used to modify the output of the source 2 to produce a controllable input signal to the amplifier 1.

The amplifier 1 is a DFB ridge waveguide laser, 300 $\mu$m long, with a coupling coefficient times length of 2.4, comprising InP with an InGaAsP active layer. Threshold current at room temperature is 57 mA and the emission wavelength 1525 nm. The diode has an active cross section of 0.4 $\mu m^2$.

The source 2 is a grating—tuned external cavity laser which provides a single-mode signal. This laser is an anti-reflection coated ridge waveguide laser, tunable in the range from 1450 to 1580 $\mu$m inclusive, again comprising InP with an InGaAsP active layer.

The isolator 8 is provided by two isolating devices, giving together 60 dB isolation. Maximum coupled powers from the source 2 to the amplifier 1 of a few hundred $\mu$W can be obtained, as deduced from the resultant photocurrent induced in the amplifier 1. The beam splitter 3 comprises a simple uncoated glass slide, and a fast PIN-preamp combination (not shown) provides temporal resolution of 100 p secs to allow switching speed measurements by directly modulating the tunable source 2.

A method of operating the switch will now be described, and results discussed.

The amplifier 1 is driven by a driving current so as to produce a material gain in the amplifier 1 of 0.95 times the lasing threshold gain. The source 2 is then driven to produce a series of input signals for the amplifier 1. Each input signal increases then decreases steadily in intensity, starting at zero, and is detuned, from a cavity resonance of the amplifier 1 at low input intensities, by a characteristic amount. All the input signals have a wavelength shorter than the stop band of the amplifier 1.

Figure 2:
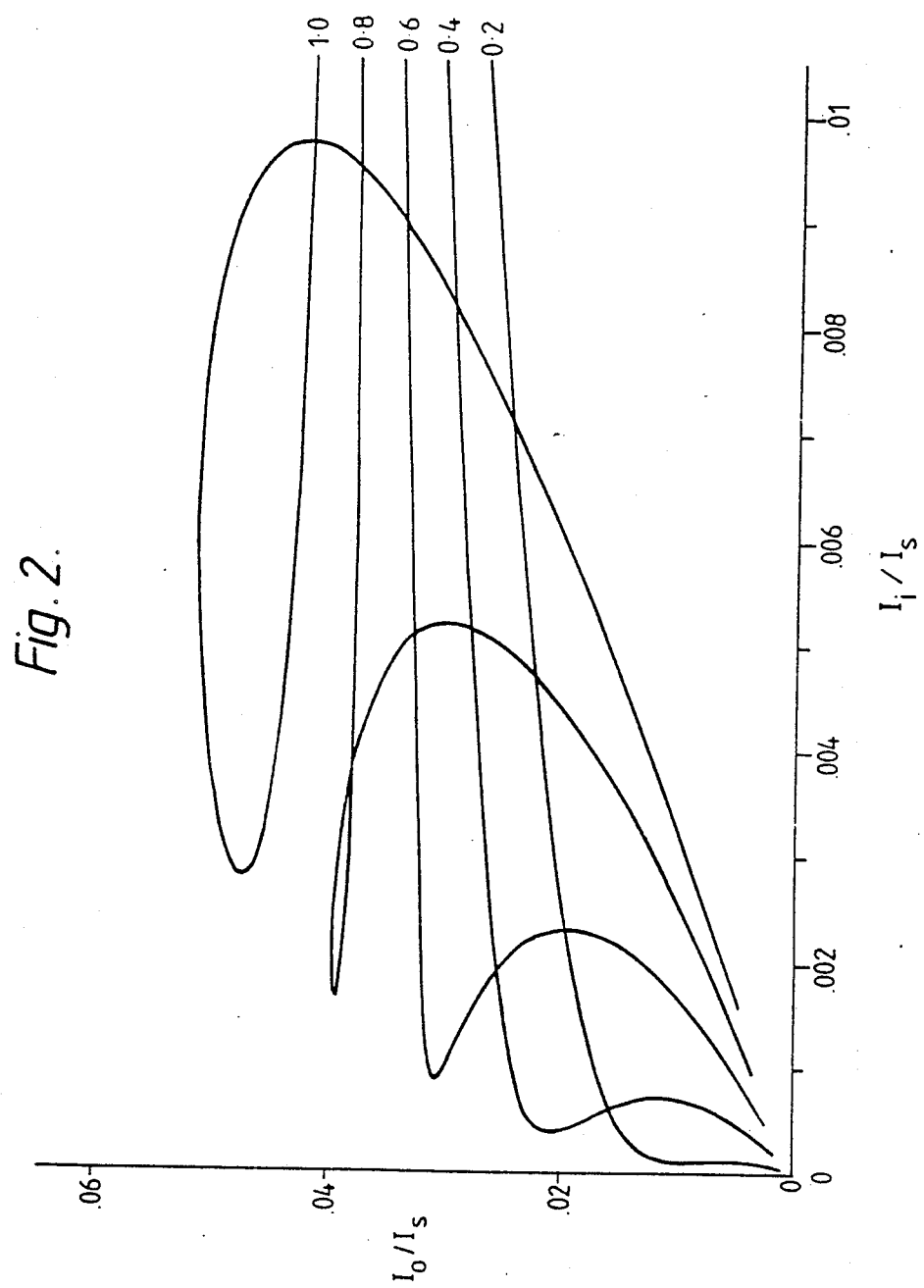
FIG. 2 shows in graph form the output signal of the limiter in response to various input signals of different wavelengths.

Referring to FIG. 2, the output signal intensity $I_o$ of the amplifier 1 tends to show bistability at low values of input signal intensity $I_i$. However, as $I_i$ increases beyond those low values, $I_o$ becomes substantially insensitive to $I_i$. (As shown on FIG. 2, both signal intensities $I_o$ and $I_i$ are normalised using a scaling intensity $I_s$.)

The amount by which each input signal is detuned, from an output peak on the snort wavelength side a stop band, corresponds to a single-pass (i.e. non-reflected) phase change of $0.06\pi$, $0.13\pi$, $0.19\pi$, $0.26\pi$, and $0.32\pi$ respectively. It can be seen that as the detuning increases, the threshold intensity value of $I_i$ above which $I_o$ is substantially independent also increases. However, at most the normalised threshold intensity value is just below 0.01. The scaling intensity $I_s$ has a value of about $8 \times 10^5$ W/cm$^2$, which over the active cross section of the amplifier 1 corresponds to a factor 8

$8 \times 10^9 \times 0.4 \times 10^{-12}$ W, or $3.2 \times 10^{-3}$ W. Thus the highest normalised value of $I_i$ corresponds to an absolute value of about 30 μW.

Figure 3:
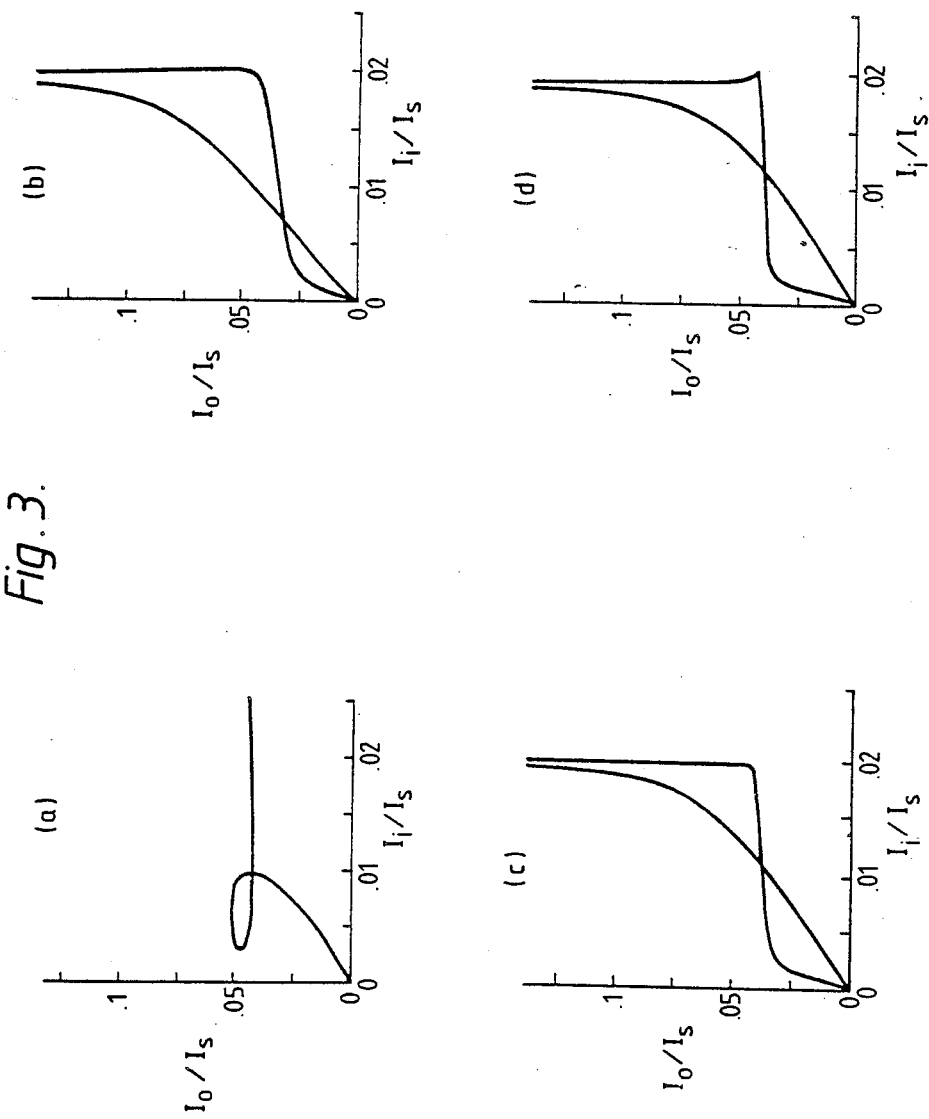
FIG. 3 shows the response of the limiter to a high frequency sinusoidal input signal.

The results described above are relevant to an input signal whose intensity varies relatively slowly. It is important to avoid operating conditions whereunder the amplifier 1 shows a spiked, resonant response as might occur with a high frequency sinusoidal input signal. Referring to FIG. 3, if the input signal has a period of the order of the carrier recombination time (about 1.7 nsecs), such a spiked response 9 is predicted. This type of response is understood to stem from changes in the material refractive index of the amplifier 1 due to changes in the optical input intensity.

To investigate the presence of the spiked response, the output of the amplifier 1 was calculated for four different input signals, an effectively steady state signal Graph (a)), and sinusoidal signals whose periods corresponded to 4, 8 and 12 times the carrier recombination time respectively Graphs (b to d) in that order). In the case of each sinusoidal signal, the spiked response 9 could be observed.

To avoid the spiked response 9, an oscillating input signal whose intensity is greater than a threshold value associated with a spiked response should be used. In the case of a binary digital signal, the intensity of the input signal in the case of a "1" value should be so selected. In embodiments of the present invention, a threshold value of less than 100 μW, and even of less than 40 μW, should be achievable.

In the embodiment of the present invention described above, the period of the grating selected for distributed feedback was second order wth regard to the wavelength of the input signal. That is, it was of the order of ½ μm. It is predicted that a lower order grating would produce a stronger coupling coefficient in the amplifier and so reduce the input signal intensities at which the device can be satisfactorily operated.

I claim:

1. An optical signal processing device comprising:
   a semiconductor DFB laser amplifier operated in reflection, said amplifier producing an optical output signal and having at least one stop band with a short wavelength side,
   means for coupling an optical input signal to the amplifier, said input signal having an optical frequency disposed to said short wavelength side of said amplifier stop band, and
   means for applying a driving current to the amplifier of less than a lasing threshold for the amplifier, said input signal an intensity greater than a threshold value above which the intensity of said amplifier output signal is substantially independent of said input signal intensity thereby limiting the optical output signal intensity.

2. An optical signal processing device according to claim 1 wherein the input signal is a binary digital signal whose intensity for a "1" value is greater than the threshold value.

3. An optical signal processing device according to claim 1 wherein the threshold value is less than 100 μW.

4. An optical signal processing device according to claim 3 wherein the threshold value is less than 40 μW.

5. An optical signal processing device according to claim 1 wherein the amplifier is provided with a grating for distributed feedback, whose period is of a low order with reference to the wavelength of the input signal.

6. An optical signal processing device according to claim 5 wherein the period of the grating is of a third order or less with reference to the wavelength of the input signal.

7. A device according to claim 1, in which said optical signal processing device is an optical signal limiter.

8. A device according to claim 1 in which said optical signal processing device is an optical signal noise filter.

9. An optical signal processing device comprising:
   a DFB laser amplifier having a frequency band sensitive response for accepting an input optical signal of varying intensity and producing, in response, an output optical signal, said amplifier having at least one stop band;
   means for coupling said input optical signal to said laser amplifier at an optical frequency located to one side of said stop band; and
   means for applying a driving current to said amplifier below its lasing threshold thereby causing said output optical signal to have an intensity substantially independent of the input optical signal intensity when said input optical signal intensity is above a predetermined threshold value thereby limiting the optical output signal intensity.

10. An optical signal processing method for operating a semiconductor DFB laser amplifier in reflection in which the amplifier produces an optical output signal having an intensity which is substantially independent of an input optical signal intensity above a predetermined threshold, the amplifier has at least one stop band having a short wavelength side, said method comprising:
    coupling an optical input signal to the amplifier, said input signal having an optical frequency disposed to the short wavelength side of the amplifier stop band, and
    applying a driving current to the amplifier of less than a lasing threshold for the amplifier, said input signal reaching an intensity greater than a threshold value above which the intensity of said amplifier output signal is substantially independent of said input signal intensity thereby limiting the optical output signal intensity.

11. An optical signal processing method for operating a DFB laser amplifier having a frequency band sensitive response means for accepting an input optical signal of varying intensity and for producing, in response, an output optical signal having a controlled intensity variation, said method comprising:
    coupling said input optical signal to said laser amplifier at an optical frequency located to one side of an amplifier stop band; and
    applying a driving current to said amplifier below its lasing threshold thereby causing said output optical signal to have an intensity substantially independent of the input optical signal intensity when said input optical signal intensity is above a predetermined threshold value thereby limiting the optical output signal intensity.

* * * * *

UNITED STATES PATENT AND TRADEMARK OFFICE
CERTIFICATE OF CORRECTION

PATENT NO. : 4,962,502

DATED : October 9, 1990

INVENTOR(S) : Michael J. Adams

It is certified that error appears in the above-identified patent and that said Letters Patent is hereby corrected as shown below:

Column 1, line 45, a comma should be inserted after "arsenide".
Column 1, line 60, a colon should be inserted after "frequency".
Column 2, line 26, "Can" should read -- can --.
Column 2, line 28, "carrier)" should read -- (carrier) --.
Column 2, line 36, a comma should be inserted after "laser)".
Column 2, line 66, a closing parenthesis should be inserted after "sities."
Column 3, line 4, -- laser amplifier can be -- should be inserted before "operated".
Column 3, line 58, the comma after "intensity" should be deleted.
Column 4, line 59, "snort" should read -- short --; and -- of -- should be inserted after "side".
Column 5, line 18, a parenthesis should be inserted before "Graph".
Column 5, line 20, a parenthesis should be inserted before "Graphs".
Column 5, line 33, "wth" should read -- with --.
Column 5, line 52 (claim 1), -- reaching -- should be inserted after "signal".
Column 6, line 34 (claim 10), "has" should read -- having --.

Signed and Sealed this

Twenty-ninth Day of September, 1992

Attest:

DOUGLAS B. COMER

*Attesting Officer*   *Acting Commissioner of Patents and Trademarks*